(12) United States Patent
Koo et al.

(10) Patent No.: US 8,721,834 B2
(45) Date of Patent: May 13, 2014

(54) APPARATUS FOR TREATING SUBSTRATE

(75) Inventors: Kyo-Woog Koo, CheonAn-si (KR);
Jeong-Min Kim, BuSanGwangYeok-oi (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 1616 days.

(21) Appl. No.: 11/524,320

(22) Filed: Sep. 21, 2006

(65) Prior Publication Data
US 2007/0163711 A1    Jul. 19, 2007

(30) Foreign Application Priority Data

Jan. 13, 2006    (KR) .................. 10-2006-0003860

(51) Int. Cl.
*H01L 21/306*    (2006.01)

(52) U.S. Cl.
USPC ............... 156/345.11; 156/345.1; 134/902

(58) Field of Classification Search
USPC .......... 134/149, 119, 902; 156/345.1, 345.55, 156/345.11
See application file for complete search history.

(56) References Cited

U.S. PATENT DOCUMENTS

| | | | |
|---|---|---|---|
| 4,903,717 A | 2/1990 | Sumnitsch | |
| 6,315,832 B1 * | 11/2001 | Liu | ............... 118/602 |
| 6,793,769 B2 * | 9/2004 | Kajino et al. | ............ 156/345.55 |
| 7,431,038 B2 * | 10/2008 | Nishikido | ................... 134/95.1 |
| 2004/0226655 A1 | 11/2004 | Kajino et al. | |

FOREIGN PATENT DOCUMENTS

JP    10-074725    3/1998
WO    WO 2004/084278    9/2004

* cited by examiner

*Primary Examiner* — Sylvia R MacArthur
(74) *Attorney, Agent, or Firm* — Harness, Dickey & Pierce, P.L.C.

(57) ABSTRACT

There is provided an apparatus for treating a substrate using a plurality of treatment solutions in sequence. The apparatus includes treatment liquid collecting vessels for separately collecting used treatment solutions, and an exhaust member for separately discharging pollutant gases generated during a process.

20 Claims, 12 Drawing Sheets

APPARATUS FOR TREATING SUBSTRATE

PRIORITY STATEMENT

This application claims priority under 35 U.S.C. §119 to Korean Patent Application No. 10-2006-0003860, filed on Jan. 13, 2006 in the Korean Intellectual Property Office (KIPO), the entire contents of which are incorporated herein by reference.

BACKGROUND OF THE INVENTION

1. Field of the Invention

The present invention relates to an apparatus for treating a semiconductor substrate, and more particularly, to an apparatus for treating a substrate by supplying a plurality of treatment solutions to the substrate.

2. Description of the Related Art

Various processes such as deposition, photolithography, etching, and polishing are performed for manufacturing a semiconductor device. In an etch process, an etching solution or gas is applied to a wafer to remove a layer, an organic material, or particles from the wafer in a predetermined pattern.

Various etching solutions are used for etching a wafer depending on the type of a layer or material to remove from the wafer. In a conventional etching device, a drain tube is connected to a sidewall or bottom wall of a single vessel where a chuck is installed for receiving a wafer. A supply tube is placed above the vessel to supply etching solutions and deionized water to the wafer placed on the chuck. However, when a plurality of etching solutions are sequentially supplied to the wafer for etching the wafer, a discharging etching solution is mixed with a remaining etching solution on the vessel or in the drain tube. Therefore, the discharged etching solution cannot be reused, thereby wasting expensive etching solutions.

Further, when the etching process is performed using different etching devices depending on the types of etching solutions to prevent above-described problems, it takes much more time to carry the wafer from one device to another device, and semiconductor process equipment become larger due to the plurality of etching devices.

Furthermore, pollutant gases such as fumes are generated from etching solutions during an etch process. When the fumes are discharged through the same passage and exhaust tube, the fumes can react with each other in the passage or exhaust tube. In this case, an undesired layer can be deposited on the inner surface of the passage or the exhaust tube, and thus exhaust pressure can be out of a predetermined range, increasing the possibility of process errors. Particularly, when an acid fume and a basic fume are included in the generated pollutant gases, the above-described problems become much more serious due to intensive reaction between the acid fume and the basic fume.

SUMMARY OF THE INVENTION

The present invention provides an apparatus for treating a substrate efficiently.

The present invention also provides an apparatus for treating a substrate, in which treatment liquid such as an etching solution is collected and reused.

The present invention further provides an apparatus for treating a substrate, which has an improved structure for preventing reaction between fumes generated during a process and thus reducing process errors due to a deposited layer by the reaction.

Embodiments of the present invention provide apparatuses for treating a substrate using a plurality of treatment solutions. The apparatuses include: a supporting member receiving the substrate thereon and rotating the substrate; a treatment liquid supplying member supplying the treatment solutions to the substrate placed on the supporting member; a treatment liquid collecting member forming a space for placing the supporting member and including a plurality of treatment liquid collecting vessels arranged for separately collecting the treatment solutions supplied from the treatment liquid supplying member; an exhaust member separately discharging pollutant gases generated from the treatment solutions during the treatment of the substrate; and a lifting member moving at least one of the supporting member and the treatment liquid collecting member so as to change a height of the supporting member relative to inlets of the treatment liquid collecting vessels.

In some embodiments, the treatment liquid collecting vessels surround the supporting member one after another, and the inlet of a more distant treatment liquid collecting vessel is higher than that of a closer treatment liquid collecting vessel. The treatment liquid collecting vessels include an inner collecting vessel closest to the supporting member, and an outer collecting vessel most distant from the supporting member. The inner collecting vessel includes an inner base and an inner guide. The inner base includes a bottom wall, an inner wall, and an outer wall that form a space for receiving the treatment solution and the pollutant gas. The inner base is formed with a drain hole for discharging the treatment solution, and the inner wall of the inner base is formed with an exhaust hole for discharging the pollutant gas. T inner guide is disposed on the outer wall of the inner base and provides a passage to introduce the treatment solution and the pollutant gas into the space formed in the inner base.

In other embodiments, the outer collecting vessel includes an outer base and an outer guide. The outer base includes a bottom wall and an outer wall that form a space for receiving the treatment solution and the pollutant gas, and is formed with a drain hole for discharging the treatment solution. The outer guide is disposed on the outer wall of the outer base and provides a passage to introduce the treatment solution and the pollutant gas into the space formed in the outer base.

In still other embodiments, the inner guide is disposed on the outer wall of the inner base by a groove-protrusion engagement structure formed on an upper end of the outer wall of the inner base and a lower end of the inner guide.

In even other embodiments, the outer base is formed with a plurality of exhaust holes, and the exhaust member includes: exhaust tubes connected to the exhaust holes, respectively; and a separating plate dividing the space formed in the outer base, such that the pollutant gas introduced into the space of the outer base through the outer guide is separately discharged from a pollutant gas introduced into the space of the outer base through the inner guide and the inner base. The exhaust holes are formed in an edge region of the outer base, and the separating plate divides the space of the outer base into an inner space and an outer space. The inner space communicates with the exhaust hole of the inner base and at least one of the exhaust holes of the outer base. The outer space communicates with the outer guide and at least one of the exhaust holes of the outer base.

In yet other embodiments, the exhaust holes are formed in an edge region of the outer base, and the separating plate includes: a barrier portion disposed between the edge region and a center region of the outer base and forming an inner space communicating with the exhaust hole of the inner base; and an extension portion protruding from the barrier portion into the edge region of the outer base so as to extend the inner space of the barrier portion into the edge region of the outer base and communicate with some of the exhaust holes of the outer base.

In further embodiments, the outer base may be formed with an upwardly protruded ridge on a bottom, and the separating plate may have a lower end formed with a groove corresponding to the ridge of the outer base, such that the separating plate is coupled to the outer base by engaging the groove and the ridge.

In still further embodiments, each of the exhaust tubes connected to the exhaust holes has a leading end protruded from the bottom wall of the outer base by a predetermined length.

In even further embodiments, the treatment liquid collecting vessels further include at least one middle collecting vessel between the inner collecting vessel and the outer collecting vessel. The middle collecting vessel includes a middle base and a middle guide. The middle base includes a bottom wall, an inner wall, and an outer wall that form a space for receiving the treatment solution and the pollutant gas, and the middle base is formed with a drain hole for discharging the treatment solution. The inner wall of the middle base is formed with an exhaust hole for discharging the pollutant gas. The middle guide is disposed on the outer wall of the middle base and provides a passage to introduce the treatment solution and the pollutant gas into the space formed in the middle base.

In yet further embodiments, the middle base and the inner base may formed in one piece, the inner guide may be disposed on the outer wall of the inner base by a groove-protrusion engagement structure formed on an upper end of the outer wall of the inner base and a lower end of the inner guide, the middle guide may be disposed on the outer wall of the middle base by a groove-protrusion engagement structure formed on an upper end of the outer wall of the middle base and a lower end of the middle guide, and the outer guide may be disposed on the outer wall of the inner base by a groove-protrusion engagement structure formed on an upper end of the outer wall of the outer base and a lower end of the outer guide.

In other embodiments, the treatment solutions include at least two different etching solutions that are supplied to the substrate on the supporting member at different times. The treatment solutions may further include a cleaning solution supplied to the substrate on the supporting member at a different time from the etching solutions.

In still other embodiments, the treatment solutions may include at least two different etching solutions supplied to the substrate on the supporting member at different times and a cleaning solution supplied to the substrate on the supporting member at a different time from the etching solutions, and the apparatus may further include a controller controlling the lifting member, such that the cleaning solution is discharged through the outer collecting vessel and the etching solutions are discharged through the inner collecting vessel and the middle collecting vessel.

In even other embodiments, the supporting member includes a supporting plate receiving the substrate thereon, a supporting shaft supporting the supporting plate, and a substrate driving unit rotating the supporting shaft. The treatment liquid supplying member includes a nozzle disposed above the substrate placed on the supporting plate during a process, a supporting arm coupled to the nozzle, and a nozzle driving unit actuating the supporting arm to move the nozzle toward and away from the substrate placed on the supporting plate. The lifting member includes a base to which the supporting plate and the supporting arm are fixed, and a vertical driving unit moving the base up and down.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
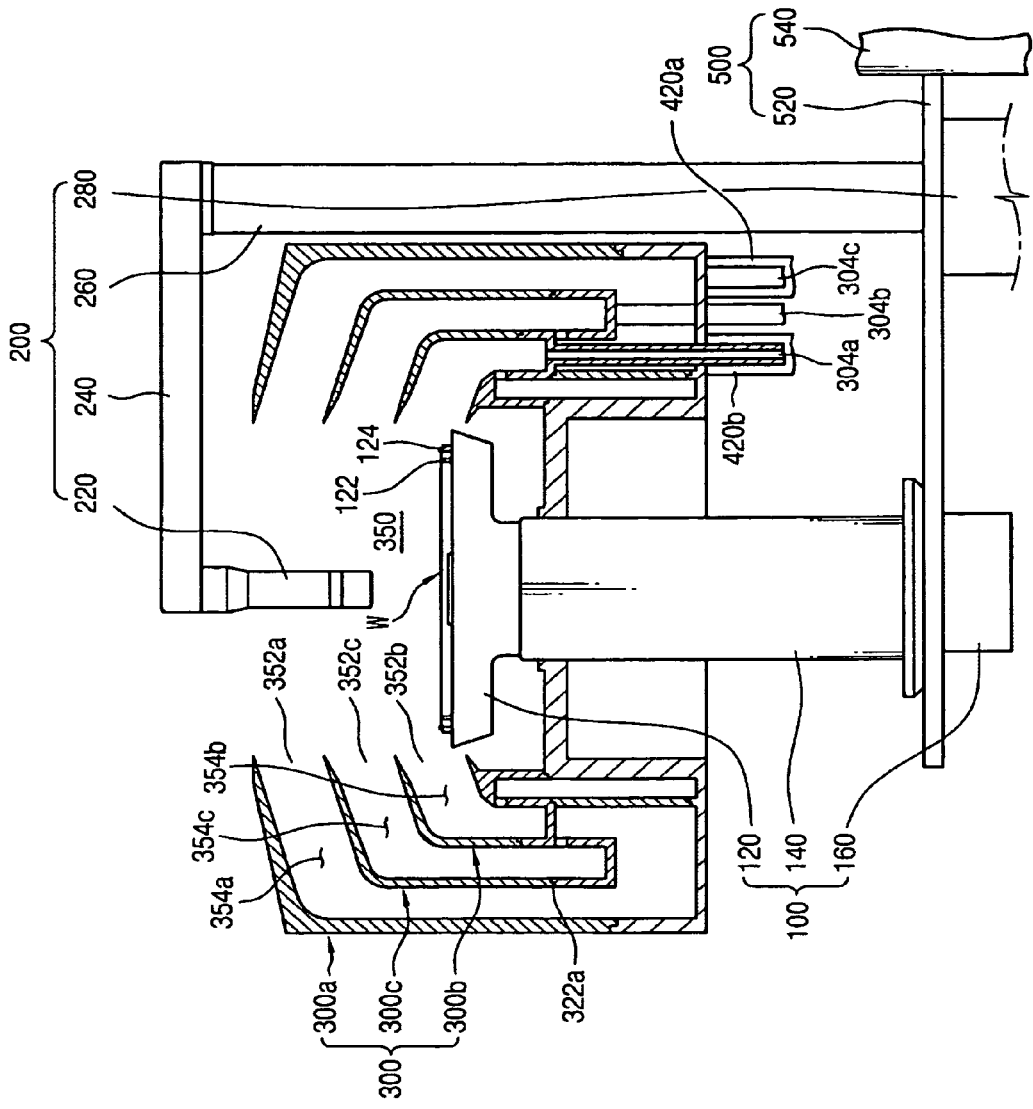
FIG. 1 is a schematic sectional view of an apparatus for treating a substrate according to an embodiment of the present invention.

The present invention will now be more fully described with reference to FIGS. 1 through 13 according to preferred embodiments of the present invention. However, the present invention is not limited to the embodiments illustrated herein after, and the embodiments herein are rather introduced to provide easy and complete understanding of the scope and spirit of the present invention. In the drawings, the thicknesses of layers and regions are exaggerated for clarity.

Embodiments of the present invention discuss an apparatus for etching a substrate such as a wafer (W) using treatment liquid such as etchant and cleaning solution. However, the present invention is not limited to the etching apparatus. The present invention can be applied to various apparatuses used in a process for treating a wafer (W) by applying a plurality of treatment solutions to the wafer (W). Further, although a wafer (W) is selected as an example of a substrate in the embodiments of the present invention, the present invention is not limited to treating a wafer (W). That is, the present invention can be used for various substrates such as a glass substrate.

FIG. 1 is a schematic sectional view of an apparatus for treating a substrate according to an embodiment of the present invention. Referring to FIG. 1, the substrate treating apparatus includes a substrate supporting member 100, a treatment liquid supplying member 200, a treatment liquid collecting member 300, an exhaust member 400, and a lifting member 500.

The substrate supporting member 100 supports a wafer (W) when the wafer (W) is treated and rotates the wafer (W) when the wafer (W) is not treated. The substrate supporting member 100 includes a supporting plate 120 having a circular top surface. The supporting plate 120 includes supporting pins 122 on a top center portion that contact and support the wafer (W). The supporting plate 120 further includes aligning pins 124 on a top edge portion that align the wafer (W) to place it at a desired position. About three or six aligning pins 124 are rotatably installed at regular intervals. During a process, the aligning pins 124 make contact with the wafer (W) from a side, thereby maintaining the exact position of the wafer (W). Alternatively, the supporting member 100 can directly support the wafer (W) by applying a suction force using vacuum lines (not shown) formed in the supporting plate 120 instead of using the supporting pins 122. A supporting shaft 140 is fixedly coupled to a bottom surface of the supporting plate 120. The supporting shaft 140 can be rotated by a substrate driving unit 160. The substrate driving unit 160 includes a motor (not shown) to rotate the supporting shaft 140.

The treatment liquid supplying member 200 supplies treatment liquid to the wafer (W) place on the substrate supporting member 100. The treatment liquid supplying member 200 is substantially perpendicular to the wafer (W) placed on the supporting plate 120. The treatment liquid supplying member 200 includes a nozzle 220 supported by a supporting arm to supply treatment liquid to the wafer (W). The supporting arm includes a horizontal supporting arm 240 and a vertical supporting arm 260. The horizontal supporting arm 240 is horizontally installed and makes a right angle with the nozzle 220. The nozzle 220 is coupled to one end of the horizontal supporting arm 240. The vertical supporting arm 260 stands at a right angle to the horizontal supporting arm 240 and is coupled to the other end of the horizontal supporting arm 240. If necessary, the vertical supporting arm 260 is rotated by a nozzle driving unit 280. The nozzle driving unit 280 includes a motor (not shown) to rotate the horizontal supporting arm 260.

The treatment liquid supplying member 200 supplies a plurality of treatment solutions. For example, the treatment liquid supplying member 200 can sequentially supply a plurality of etching solutions (etchant) to the wafer (W). Further, the treatment liquid supplying member 200 can supply a cleaning solution such as deionized water. The nozzle 220 of the treatment liquid supplying member 200 may include a plurality of passages for different treatment solutions. In this case, different treatment solutions may be supplied to the wafer (W) through different passages of the nozzle 220. Alternatively, the treatment liquid supplying member 200 can include a plurality of nozzles for supplying different treatment solutions to the wafer (W) through different nozzles. Various kinds of etching solutions can be supplied to the wafer (W) through the treatment liquid supplying member 200 depending on the type of a layer to be etched. In the exemplary embodiments of the present invention, the treatment liquid supplying member 200 is designed to supply two etching solutions and one cleaning solution. For example, the two etching solutions are an acid etching solution and a basic etching solution, respectively, and the cleaning solution is deionized water.

Figure 2:
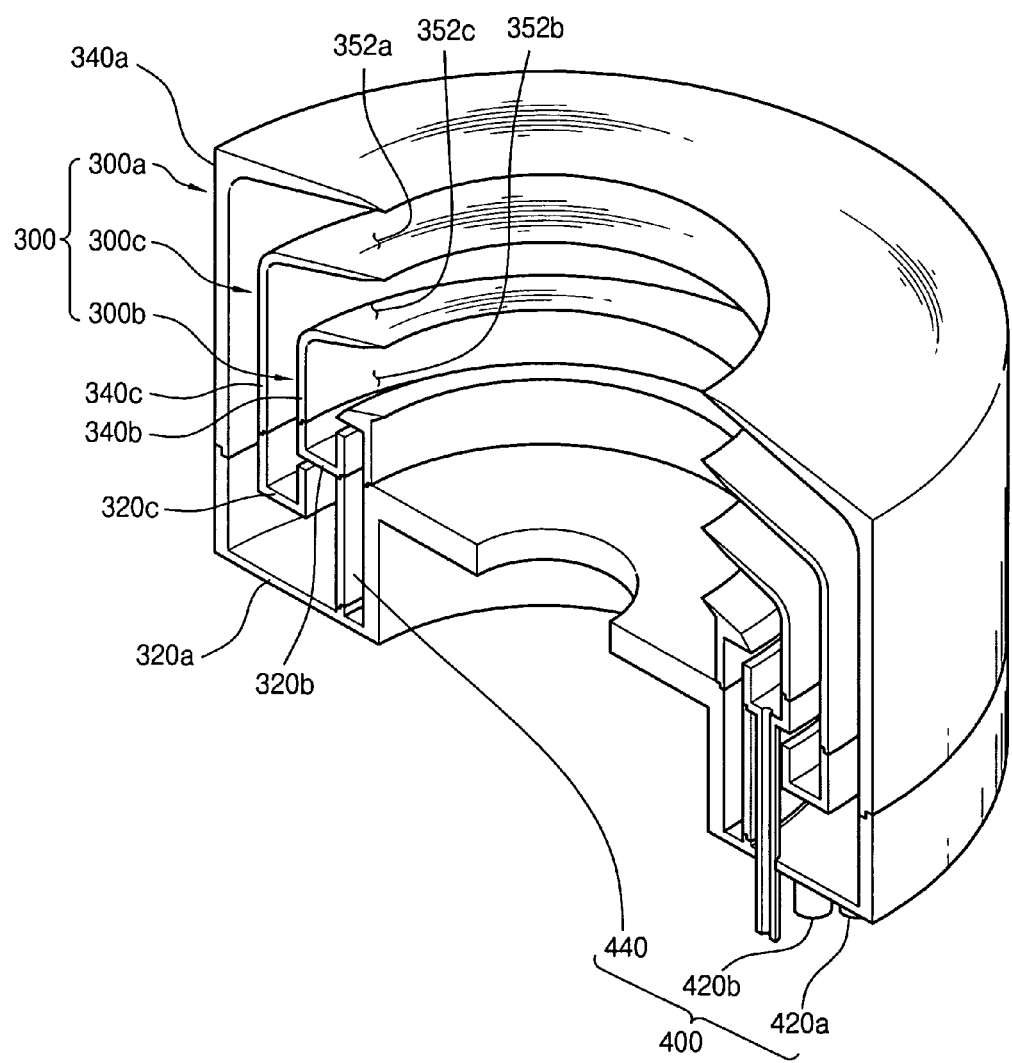
FIG. 2 is a side-sectional perspective view of a treatment liquid collecting member of the apparatus depicted in FIG. 1.
Figure 3:
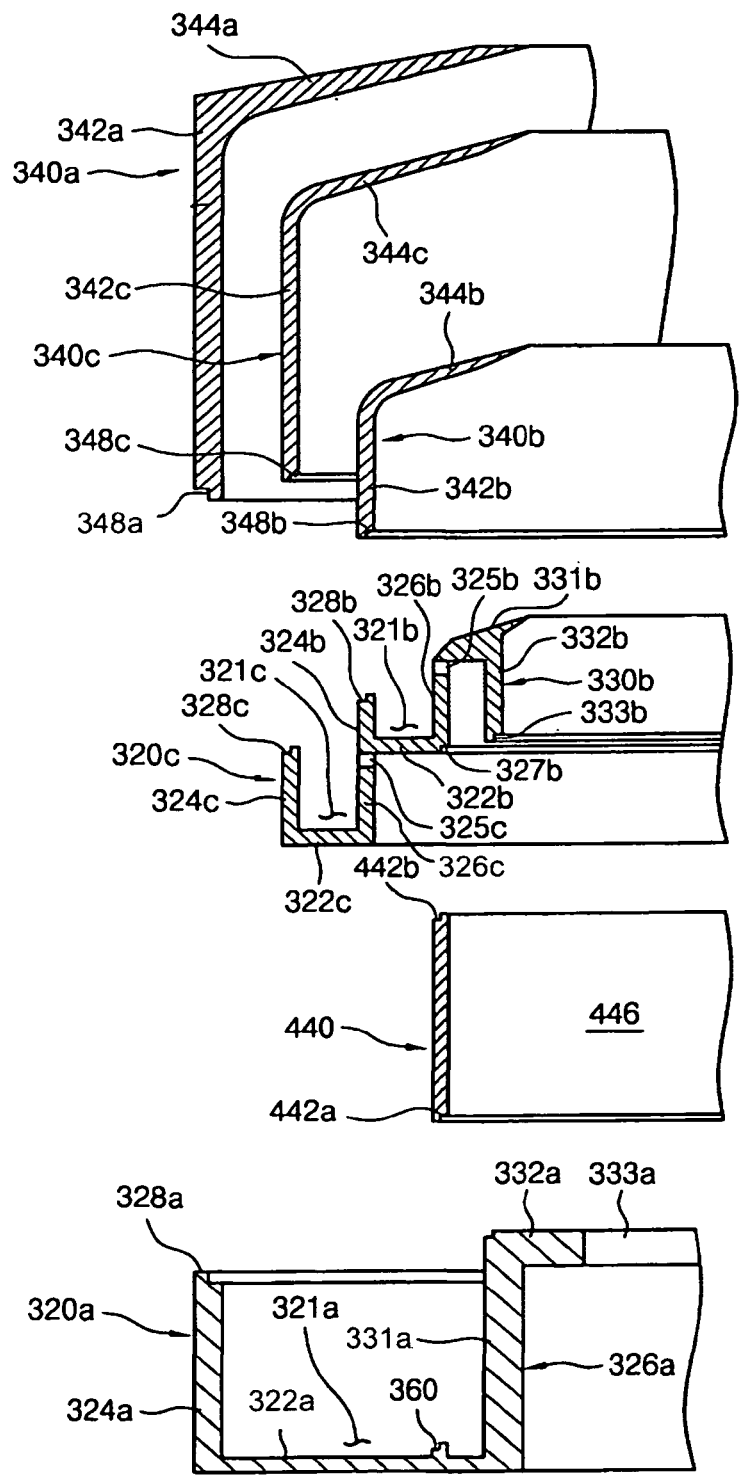
FIG. 3 is an exploded sectional view of the treatment liquid collecting member depicted in FIG. 2.
Figure 4:
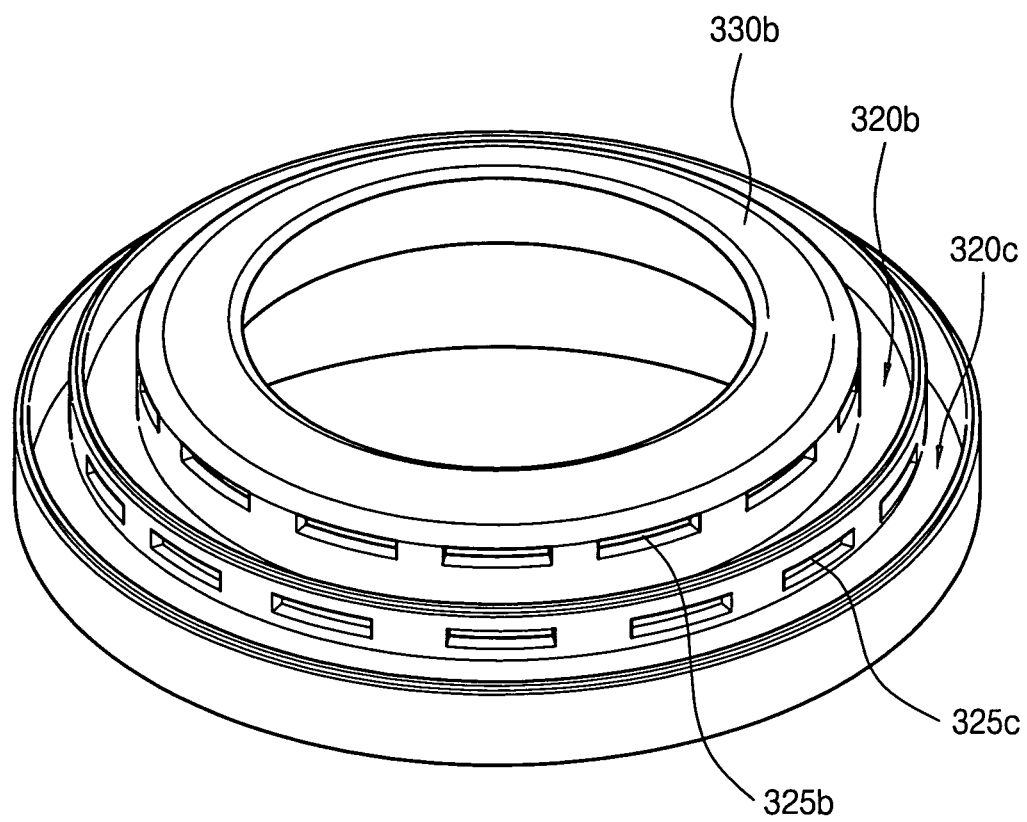
FIG. 4 is a perspective view of an inner base and a middle base of the treatment liquid collecting member.
Figure 5:
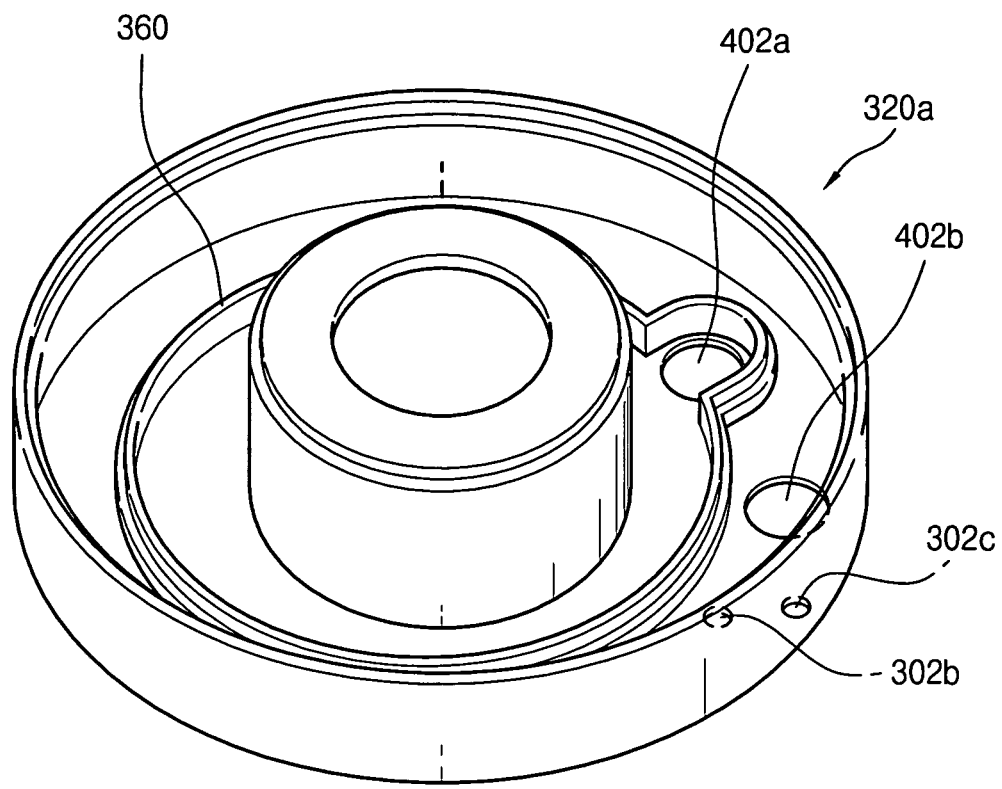
FIG. 5 is a perspective view of an outer base of the treatment liquid collecting member.

The treatment liquid collecting member 300 collects treatment liquid (particularly, the etching solutions) supplied from the nozzle 220 to reuse the treatment liquid. FIG. 2 is a side-sectional perspective view of the treatment liquid collecting member 300, and FIG. 3 is an exploded sectional view of the treatment liquid collecting member 300. Further, FIG. 4 is a perspective view of an inner base 320b and a middle base 320c of the treatment liquid collecting member 300, and FIG. 5 is a perspective view of an outer base 320a of the treatment liquid collecting member 300. Referring to FIGS. 2 through 5, the treatment liquid collecting member 300 includes an empty space 350 at a center portion for placing the supporting plate 120. The treatment liquid collecting member 300 further includes treatment liquid collecting vessels 300a, 300b, and 300c surrounding the supporting plate 120, and drain tubes 304a, 304b, and 304c connected to the respective treatment liquid collecting vessels 300a, 300b, and 300c. The outermost collecting vessel 300a is referred to as an outer collecting vessel, the innermost collecting vessel 300b is referred to as an inner collecting vessel, and the collecting vessel 300c disposed between the outer collecting vessel 300a and the inner collecting vessel 300b is referred to as a middle collecting vessel. Although a single middle collecting vessel 300c is used in the current embodiment, a plurality of middle collecting vessel can be used depending on the number of treatment solutions used.

The structures of the treatment solution collecting vessels 300a, 300b, and 300c will now be described in detail.

The outer collecting vessel 300a includes the outer base 320a and an outer guide 340a. The outer base 320a includes a bottom wall 322a, an outer wall 324a, and an inner frame 326a. The bottom wall 322a has a washer-like shape. The outer wall 324a is vertically protruded from an outer edge of the bottom wall 322a to a predetermined height. The inner frame 326a includes a vertical portion 331a and a horizontal portion 332a. The vertical portion 331a is vertically protruded from an inner edge of the bottom wall 322a to a predetermined height, and the horizontal portion 332a extends horizontally from a top end of the vertical portion 331a. A hole 333a is formed in a center portion of the horizontal portion 332a to receive the supporting shaft 140. In the outer base 320a, a ring-shaped space 321a is formed by the outer wall 324a, the bottom wall 322a, and the inner frame 326a.

The outer guide 340a includes a ring-shaped vertical sidewall 342a and a ring-shaped upper wall 344a inclined upwardly and inwardly from a top end of the sidewall 342a. Owing to the upper wall 344a, pollutant gas can be smoothly introduced.

An upper end 328a of the outer wall 324a of the outer base 320a is formed with a protrusion and a groove, and a lower end 348a of the sidewall 342a of the outer guide 340a is formed with a protrusion and a groove that are corresponding to those of the upper end 328a, such that the upper end 328a and the lower end 340a can be stably engaged. For example, the upper end 328a has an outer protrusion and an inner groove, and the lower end 348a has an inner protrusion and an outer groove for engagement with the upper end 328a. In another example, a concave-convex engagement structure can be used for the engagement between the upper end 328a and the lower end 348a.

The inner collecting vessel 300b includes the inner base 320b and an inner guide 340b. The inner base 340b is vertically disposed in the ring-shaped space 321a of the outer base 320a and spaced a predetermined distance from the outer base 320a. The inner base 320b includes a bottom wall 322b, an outer wall 324b, and an inner wall 326b. The bottom wall 322b has a washer-like shape. The outer wall 324b is vertically protruded from an outer edge of the bottom wall 322b to a predetermined height. The inner wall 326b is vertically protruded from an inner edge of the bottom wall 322b to a predetermined height. In the inner base 320b, a ring-shaped space 321b is formed by the outer wall 324b, the bottom wall 322b, and the inner wall 326b.

The inner guide 340b includes a ring-shaped vertical sidewall 342b and a ring-shaped upper wall 344b inclined upwardly and inwardly from a top end of the sidewall 342b.

Openings 325b are formed in the inner wall 326b of the inner collecting vessel 300b. During a process, pollutant gas introduced along the inner guide 340b passes through the openings 325b toward the space 321a of the outer base 320a. The openings 325b are arranged along the entire surface of the inner wall 326b at regular intervals.

An upper end 328b of the outer wall 324b of the inner base 320b is formed with a protrusion and a groove, and a lower end 348b of the sidewall 342b of the inner guide 340b is formed with a protrusion and a groove that are corresponding to those of the upper end 328b, such that the upper end 328b and the lower end 348b can be stably engaged. For example, the upper end 328b has an inner protrusion and an outer groove, and the lower end 348b has an outer protrusion and an inner groove for engagement with the upper end 328b. In another example, a concave-convex engagement structure can be used for the engagement between the upper end 328b and the lower end 348b.

A fixing frame 330b is provided inside the inner base 320b. The fixing frame 330b includes a washer-shaped upper wall 331b and a ringing-shaped sidewall 332b. The upper wall 331b is inclined upwardly and inwardly from a top end of the inner wall 326b of the inner base 320b, and the sidewall 332b vertically extends from an inner edge of the upper wall 331b in a downward direction. The fixing frame 330b and the inner base 320b may be formed in one piece.

A lower end 333b of the sidewall 332b of the fixing frame 330b is formed with a protrusion and a groove, and an upper end 442a of the inner frame 326a of the outer base 320a is formed with a protrusion and a groove that are corresponding to those of the lower end 333b, such that the upper end 442a and the lower end 333b can be stably engaged. For example, the upper end 442a has a groove at an outer portion, and the lower end 333b has a protrusion at an outer portion for engagement with the upper end 442a. In another example, a concave-convex engagement structure can be used for the engagement between the upper end 442a and the lower end 333b.

The middle collecting vessel 300c includes the middle base 320c and a middle guide 340c. The middle base 320c is vertically disposed at an upper portion of the space 321a of the outer base 320a. That is the middle base 320c is spaced a predetermined distance from the outer base 320a. The middle base 320c includes a bottom wall 322c, an outer wall 324c, and an inner wall 326c. The bottom wall 322c has a washer-like shape. The outer wall 324c is vertically protruded from an outer edge of the bottom wall 322c to a predetermined height. In the middle base 320c, a ring-shaped space 321c is formed by the outer wall 324c, the bottom wall 322c, and the inner wall 326c. The middle base 320c may be formed integrally with the inner base 320b, and an upper end of the inner wall 326c may extend from a lower end of the outer wall 324b of the inner base 320b in a vertical direction. Alternatively, the middle base 320c and the inner base 320b can be formed in two pieces, and the upper end of the inner wall 326c of the middle base 320c can be coupled to the bottom wall 322b of the inner base 320b.

The middle guide 340c includes a ring-shaped vertical sidewall 342c and a ring-shaped upper wall 344c inclined upwardly and inwardly from a top end of the sidewall 342c.

Openings 325c are formed in the inner wall 326c of the middle base 320c. During a process, pollutant gas introduced along the middle guide 340c passes through the openings 325c toward the space 321a of the outer base 320a. The openings 325c are arranged along the entire surface of the inner wall 326c at regular intervals.

An upper end 328c of the outer wall 324c of the middle base 320c is formed with a protrusion and a groove, and a lower end 348c of the sidewall 342c of the middle guide 340c is formed with a protrusion and a groove that are corresponding to those of the upper end 328c, such that the upper end 328c and the lower end 348c can be stably engaged. For example, the upper end 328c has an inner protrusion and an outer groove, and the lower end 348c has an outer protrusion and an inner groove for engagement with the upper end 328c. In another example, a concave-convex engagement structure can be used for the engagement between the upper end 328c and the lower end 348c.

The upper wall 344b of the inner guide 340b, the upper wall 344c of the middle guide 340c, and the upper wall 344a of the outer guide 340a are sequentially arranged from the bottom to the top at a predetermined distance from one another. An inlet 352b (refer to FIG. 1) is formed between the inner guide 340b and the upper wall 331b of the fixing frame 330b. The inlet 352b faces the space 350 where the wafer (W) is placed. A passage 354b is formed between the inlet 352b and the space 321b of the inner base 320c, allowing treatment liquid and pollutant gas to flow from the inlet 352b to the space 321b. Further, an inlet 352c (refer to FIG. 1) is formed between the middle guide 340c and the inner guide 340b. The inlet 352c faces the space 350 where the wafer (W) is placed. A passage 354c is formed between the inlet 352c and the space 321c of the middle base 320c, allowing treatment liquid and pollutant gas to flow from the inlet 352c to the space 321c. Furthermore, an inlet 352a (refer to FIG. 1) is formed between the outer base 340a and the middle guide 340c. The inlet 352a faces the space 350 where the wafer (W) is placed. A passage 354a is formed between the inlet 352a and the space 321a of the outer base 320a, allowing treatment liquid and pollutant gas to flow from the inlet 352a to the space 321a.

Drain holes 302a, 302b, and 302c (refer to FIG. 8) are respectively formed in the bottom walls 322a, 322b, and 322c of the outer base 320a, the inner base 320b, and the middle base 320c. The drain tubes 304a, 304b, and 304c are connected to the drain holes 302a, 302b, and 302c, such that treatment liquid introduced into the spaces 321a, 321b, and 321c of the respective bases 320a, 320b, and 320c can be drained. Pumps (not shown) are installed in the drain tubes 302a, 304b, and 304c to discharge pollutant gas more effectively. The outer base 320a is provided with the exhaust member 400. The exhaust member 400 includes a plurality of exhaust tubes 420a and 420b and a separating plate 440. A plurality of exhaust holes 402a and 402b is formed in the bottom wall 322a of the outer base 320a, and the exhaust tubes 420a and 420b are fitted into the exhaust holes 402a and 402b. The exhaust tubes 420a and 420b are fitted such that top ends of the exhaust tubes 420a and 420b protrude from the bottom wall 322a of the outer base 320a by a predetermined length. There may be as many exhaust holes as the number of treatment solutions used. Alternatively, when deionized water is used as one of the treatment solutions, the number of the exhaust holes can be fewer by one than the number of treatment solutions.

When pollutant gases are discharged from the respective collecting vessels 300a, 300b, and 300c through the same passage, a remaining pollutant gas can react with the following pollutant gas. In this case, a deposition layer can be formed on the passage. The deposition layer can result in undesired particles. Further, when the deposition layer is formed to a considerably large thickness, the exhausting pressure of the passage can be out of a set range, causing process errors. Particularly, when an etching solution generating an acid pollutant gas is used together with an etching solution generating a basic pollutant gas, the above-describe problems occur more seriously because of intensive reaction between the acid and basic pollutant gases.

Therefore, when two or more etching solutions are used, it is preferable that pollutant gases be discharged through different exhaust passages. In the current embodiment of the present invention, pollutant gases can be mixed in the space 321a of the outer base 320a. Therefore, to prevent mixing of the pollutant gases, the separating plate 440 is used to divide the space 321a of the outer base 320a into a plurality of regions 321a, and 321$a_2$. Each of the regions 321$a_1$ and 321$a_2$ is connected to at least one of the treatment liquid collecting vessels 300a and 300b, and at least one exhaust hole 402 is formed for each of the regions 321$a_1$ and 321$a_2$. Depending on the amount of treatment liquid and process pressure, the number and size of the exhaust holes are determined.

The separating plate 440 is coupled to the outer base 320a by a groove-protrusion engagement structure. For example, a ridge 360 having an elevated inner edge is formed on the bottom wall 322a of the outer base 320a, and a lower end 442a of the separating plate 440 has a corresponding shape for engagement with the ridge 360. In another example, a concave-convent engagement structure can be applied to the ridge 360 and the lower end 442a of the separating plate 440.

Further, the separating plate 440 is coupled to the inner base 320b by a groove-protrusion engagement structure. For example, an upper end 442b of the separating plate 440 and a lower end 327b of the inner wall 326b of the inner base 320b can be coupled by a stepped or concave-convex engagement structure.

Since two etching solutions deionized water are used as treatment liquid in the current embodiment, the space 321a of the outer base 320a is divided into two regions 321$a_1$ and 321$a_2$ using a single separating plate 440.

Figure 6:
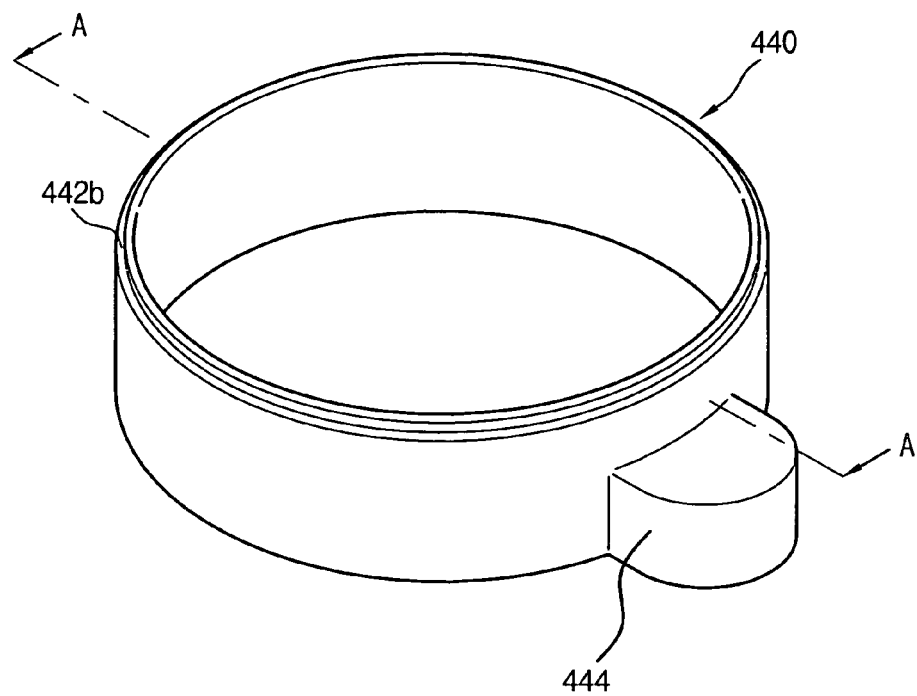
FIG. 6 is a perspective view of a separating plate of the treatment liquid collecting member according to an embodiment of the present invention.
Figure 7:
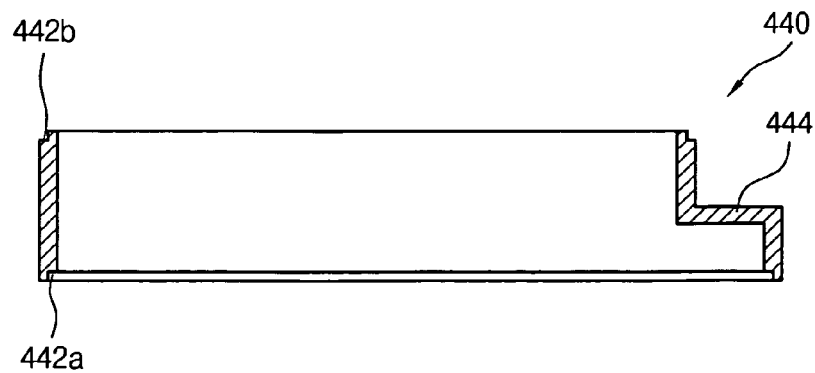
FIG. 7 is a sectional view taken along line AA' of FIG. 6.
Figure 8:
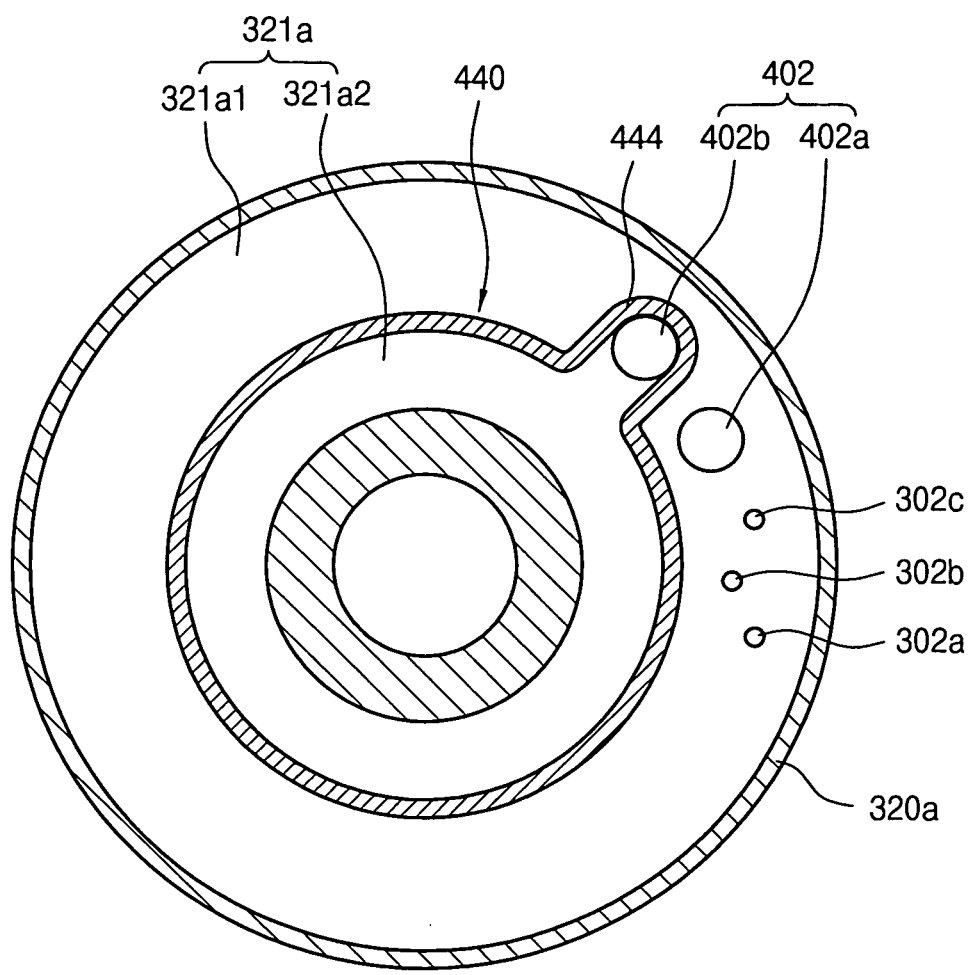
FIG. 8 is an assembled sectional view of the separating plate depicted in FIG. 6 and the outer base depicted in FIG. 5.
Figure 9:
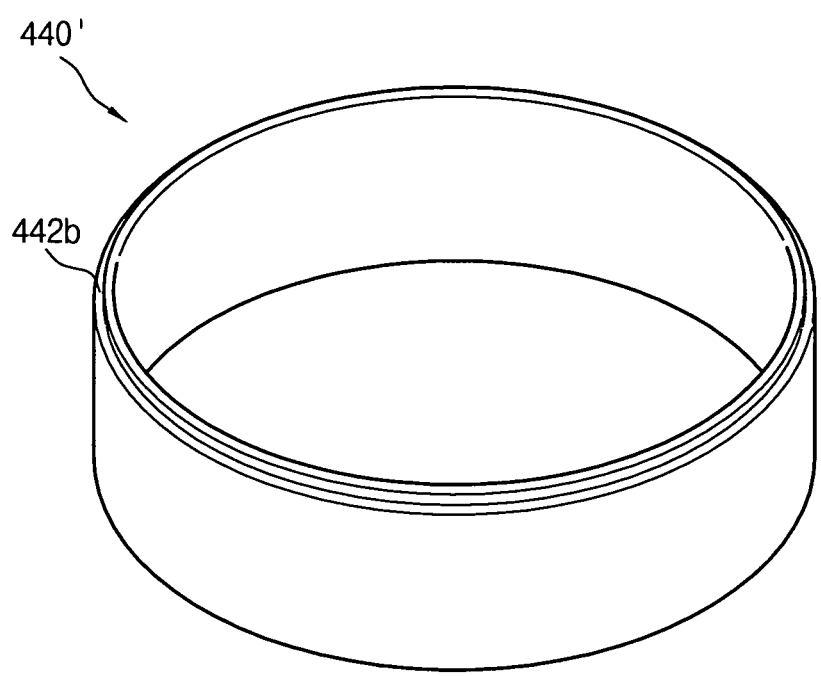
FIG. 9 is a perspective view a separating plate of the treatment liquid collecting member according to another embodiment of the present invention.

FIG. 6 is a perspective view of a separating plate 440 according to an embodiment of the present invention, FIG. 7 is a sectional view taken along line AA' of FIG. 6, and FIG. 8 is an assembled sectional view of the separating plate 440 and the outer base 320a. FIG. 9 is a perspective view a separating plate 440' according to another embodiment of the present invention, and FIG. 10 an assembled sectional view of the separating plate 440' and the outer base 320a.

Referring to FIGS. 6 through 8, the exhaust holes 402 are formed in the outer base 320a at substantially the same distance from the center of the outer base 320a. A region of the outer base 320a where the exhaust holes 402 are formed will now be referred to as an edge region 321$a_1$, and a region inside the edge region 321$a_1$ will now be referred to as a center region 321$a_2$. The separating plate 440 includes a barrier portion 442 and an extension portion 444. The barrier portion 442 is disposed between the edge region 321$a_1$ and the center region 321$a_2$, and the extension portion 444 extends from the barrier portion 442 into the edge region 321$a_1$. One or some of the exhaust holes 402 formed in the edge region 321$a_1$ of the outer base 320a are located inside the extension portion 444. The inside of the extension portion 444 communicates with the inside of the barrier portion 442, such that a pollutant gas introduced into the barrier portion 442 can be discharged through the exhaust hole 402 located inside the extension portion 444. The barrier portion 442 has an opened top and an opened bottom, and the extension portion 444 has a closed top and an open bottom. Therefore, a pollutant gas introduced into the inner collecting vessel 300b is discharged through a space enclosed by the separating plate 440, and a pollutant gas introduced into the middle collecting vessel 300c is discharged through a space outside the separating plate 440. In the current embodiment, the exhaust holes 402 can have a relatively large size when compared with the size of the inner base 320a, so that the substrate treating apparatus can have a small size.

Figure 10:
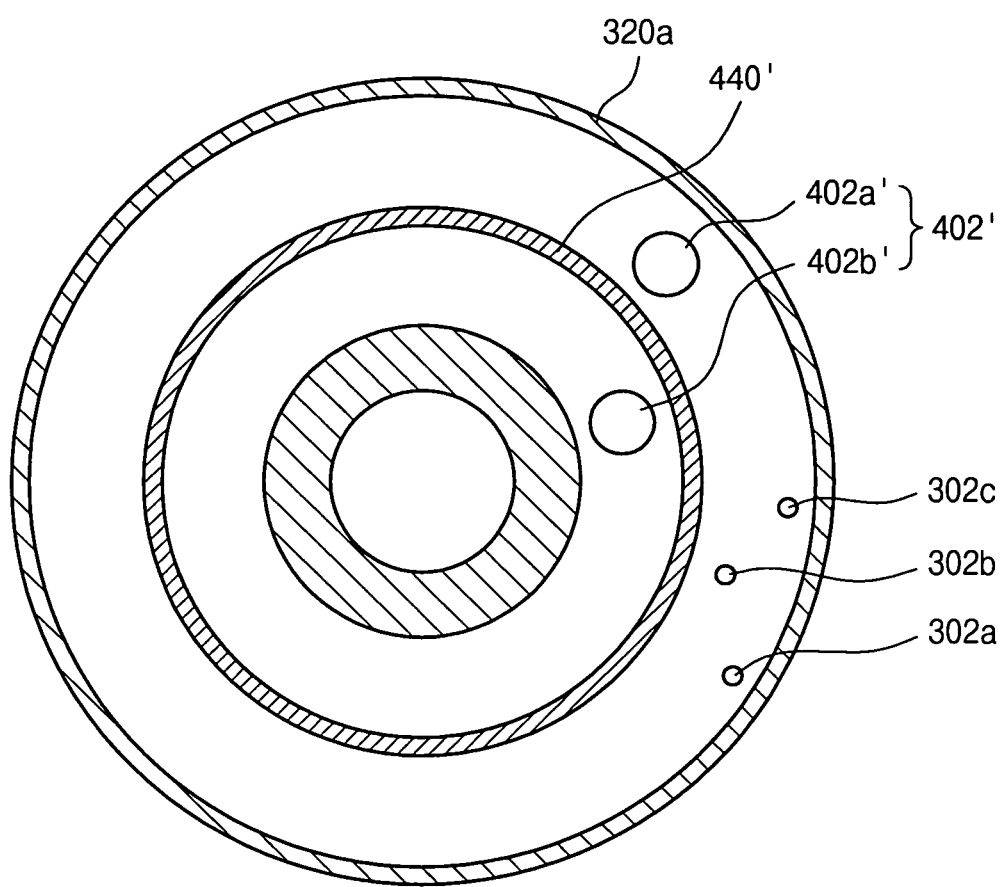
FIG. 10 an assembled sectional view of the separating plate depicted in FIG. 9 and the outer base depicted in FIG. 5.

Referring to FIGS. 9 and 10, the separating plate 440' is formed into a ring-shape, and one or more exhaust holes 402$a$' and 402$b$' are formed in the regions 321$a_1$ of the outer base 320a. The separating plate 440' has a simple structure and thus it can be easily manufactured.

A treatment solution introduced into the inner collecting vessel 300b is discharged through the drain tube 304b connected to the bottom wall 322b of the inner base 320b. A pollutant gas introduced into the inner collecting vessel 300b flows into a region of the outer base 320a enclosed by the separating plate 440' through the openings 325b formed in the inner wall 326b, and then is discharged through the exhaust hole 420b'. Further, a treatment solution introduced into the middle collecting vessel 300c is discharged through the drain tube 304c connected to the bottom wall 322c of the middle base 320c. A pollutant gas introduced into the middle collecting vessel 300c flows into a region of the outer base 320a located outside the separating plate 440' through the openings 325c formed in the inner wall 326c, and then is discharged through the exhaust hole 420a'. Furthermore, a treatment solution introduced into the outer collecting vessel 300a is discharged through the drain tube 304a connected to the bottom wall 322a of the outer base 320a. The treatment solutions discharged through the drain tubes 304a, 304b, and 304c pass through filters (not shown) and then return to the treatment liquid supplying member.

The lifting member 500 moves up and down the treatment liquid collecting member 300 or the substrate supporting member 100, such that the height of the substrate supporting member 100 can be adjusted relative to the heights of the collecting vessels 320a, 320b, and 320c of the treatment liquid collecting member 300. The lifting member 500 moves the supporting plate 120, such that the wafer (W) can be placed at a height corresponding to the inlet 352a of the outer guide 340a, the inlet 352c of the middle guide 340c, or the inlet 352b of the inner guide 340b. During a process, it is preferable that the substrate supporting member 100 and the nozzle 220 be kept at a constant distance from each other. For this, when the substrate supporting member 100 is moved up and down, the treatment liquid supplying member 200 may be moved together with the substrate supporting member 100.

For example, the lifting member 500 includes a base 520 and a vertical driving unit 540. The base 520 is fixed to the supporting shaft 140 of the substrate supporting member 100 and the vertical supporting arm 260 of the treatment liquid supporting member 200. The vertical driving unit 540 moves the base 520 vertically. Since the vertical driving unit 540 moves the nozzle 220 and the supporting plate 120 simultaneously, the distance between the nozzle 220 and the supporting plate 120 can be constantly maintained. Alternatively, the nozzle 220 and the base 520 can be moved by separate driving units.

The lifting member 500 is controlled by a controller (not shown). The controller controls the lifting member 500 in such a manner that a cleaning solution can be discharged through the outer collecting vessel 300a, and etching solutions can be discharged through the inner collecting vessel 300b and the middle collecting vessel 300c.

Figure 11:
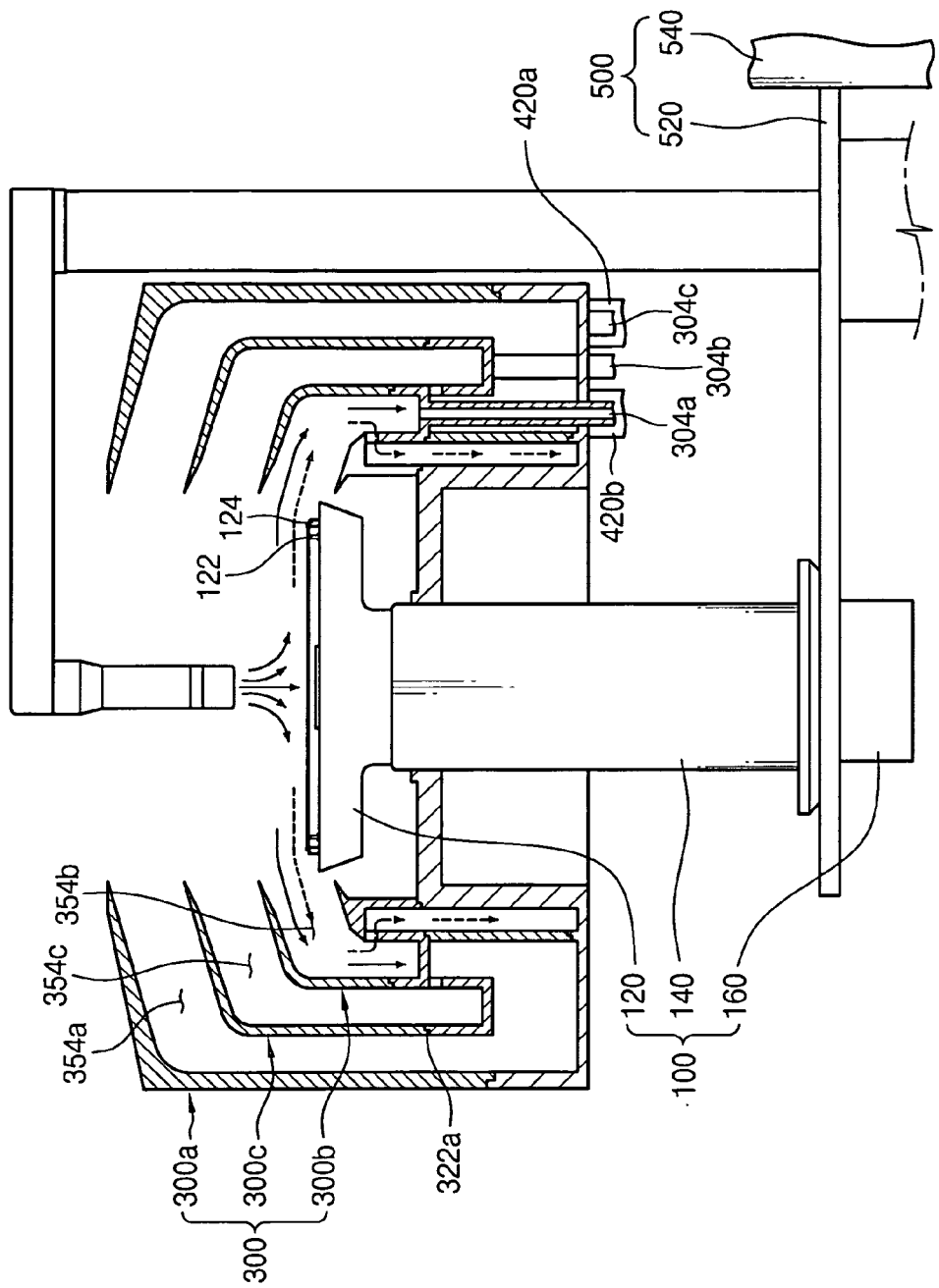
FIGS. 11 through 13 are views for explaining a process using the apparatus depicted in FIG. 1.
Figure 12:
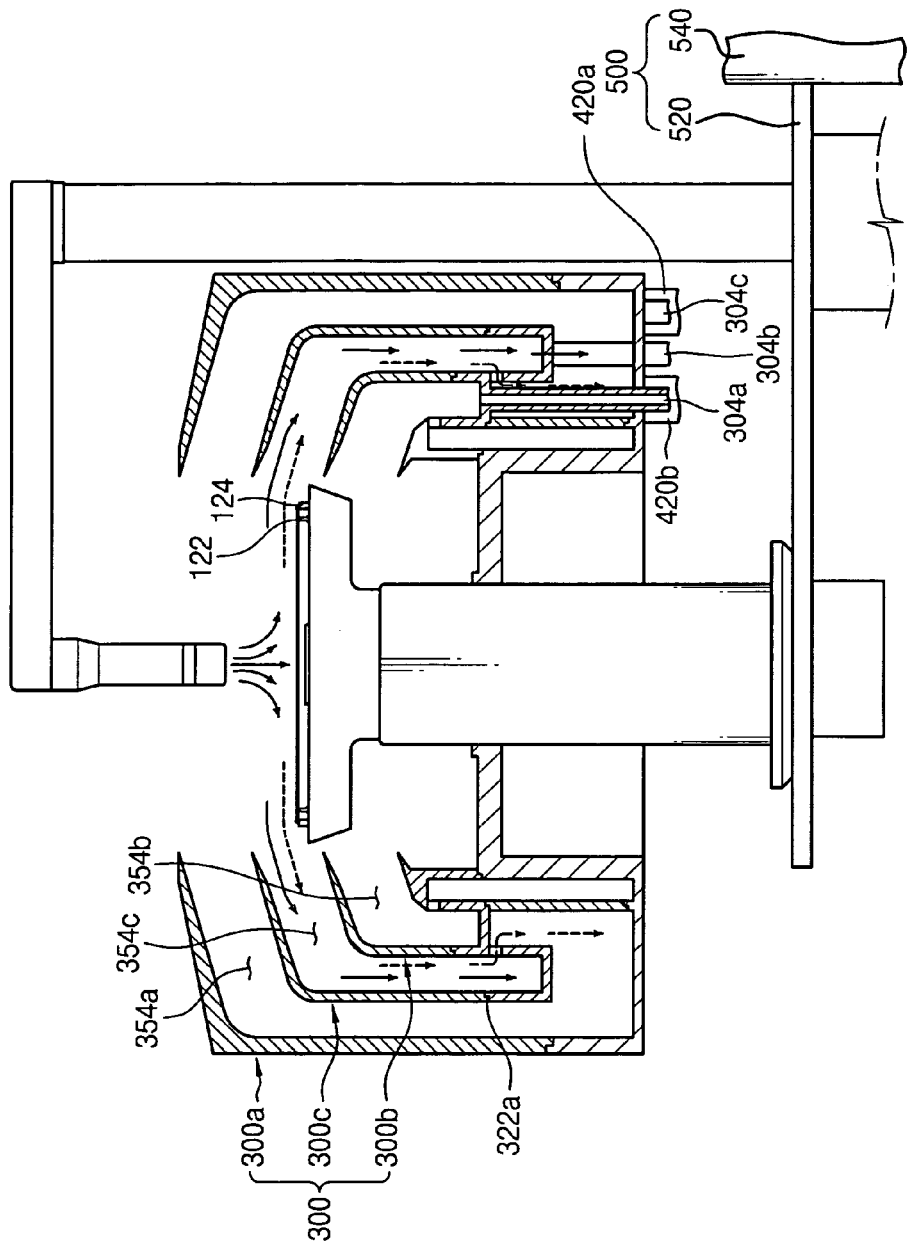
Figure 13:
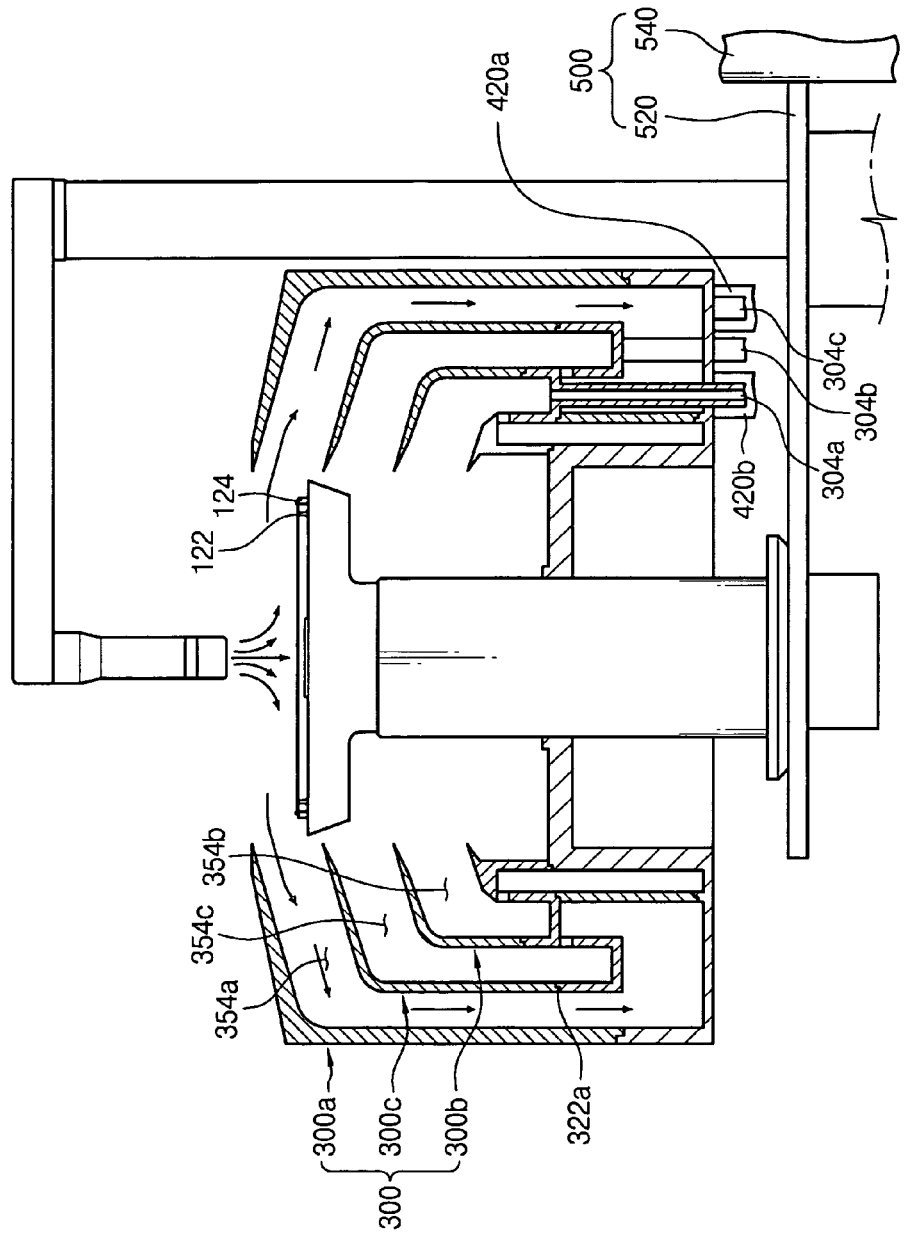

A process using the substrate treating apparatus will now be described with reference to FIGS. 11 through 13. In FIGS. 11 through 13, solid lines are used to indicate flow lines of treatment solutions, and dashed lines are used to indicate flow lines of pollutant gases.

Referring to FIG. 11, a wafer is loaded on the supporting plate 120, and then the supporting plate 120 is moved to a height of the inlet 352b of the inner collecting vessel 300b. Then, the wafer is rotated and an etching solution is supplied from the nozzle 220 to a center portion of the wafer. The etching solution spreads from the center portion to an edge portion of the wafer by a centrifugal force, and a layer or particles are moved from the wafer by the etching solution in a predetermined pattern. After that, the etching solution is collected in the inner collecting vessel 300b through the inlet 352b and then discharged through the drain tube 304a. A pollutant gas generated during the etching operation is introduced into the inner collecting vessel 300b. The introduced pollutant gas flows into the space of the outer base 320a surrounded by the separating plate 440, and then is discharged through the exhaust tube 420b.

Referring to FIG. 12, the supporting plate 120 is moved to place the wafer at a height corresponding to the inlet 352b of the middle collecting vessel 300c. Next, the wafer is rotated and another etching solution is supplied from the nozzle 220 to a center portion of the wafer. Here, this etching solution is different from the etching solution used in the previous operation shown in FIG. 11. The etching solution spreads from the center portion to an edge portion of the wafer by a centrifugal force, and a layer or particles are moved from the wafer by the etching solution in a predetermined pattern. After that, the etching solution is collected in the middle collecting vessel 300c through the inlet 352c and then discharged through the drain tube 304b. A pollutant gas generated during the etching operation is introduced into the middle collecting vessel 300c. The introduced pollutant gas flows into the space of the outer base 320a formed outside the separating plate 440, and then is discharged through the exhaust tube 420a.

Referring to FIG. 13, the supporting plate 120 is moved to place the wafer at a height corresponding to the inlet 352a of the outer collecting vessel 300a. Next, deionized water is supplied to the wafer from the nozzle 220, and the wafer is rotated. The deionized water removes remaining etching solutions from the wafer. After that, the deionized water is introduced into the outer collecting vessel 300a, and then is discharged through the drain tube 304c connected to the outer base 320a.

This cleaning operation may be finally performed after the wafer is treated using etching solutions. Alternatively, the cleaning operation can be performed each time the wafer is treated using an etching solution.

As described above, the used etching solutions can be separately collected. Therefore, the etching solutions can be reused. Further, the pollutant gases are discharged through different passages, so that reaction between the pollutant gases can be prevented. Therefore, process errors can be reduced.

According to the present invention, used etching solutions are separately discharged through drain tubes of treatment liquid collecting vessels, and used deionized water is discharged together with air. Therefore, used treatment solutions can be selectively collected and reused by a relatively simple structure.

Further, the treatment liquid collecting vessels are formed around the substrate supporting member one after another, and the inlets of the treatment liquid collecting vessels are formed in a stacked manner. In addition, the exhaust member is formed at a lower portion of the treatment liquid collecting member. Owing to this structure, gases can uniformly flow regardless of the height where treatment liquid is collected.

Furthermore, the drain tubes are perpendicularly connected to the bottom walls of the treatment liquid collecting vessels, so that used etching solutions can be effectively discharged from the treatment liquid collecting vessels.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus for treating a substrate using a plurality of treatment solutions, the apparatus comprising:

a supporting member configured to receive the substrate thereon and rotating the substrate;

a treatment liquid supplying member configured to supply the treatment solutions to the substrate placed on the supporting member;

a treatment liquid collecting member configured to form a first space for placing the supporting member and including a plurality of treatment liquid collecting vessels arranged for separately collecting the treatment solutions supplied from the treatment liquid supplying member;

an exhaust member configured to separately discharge pollutant gases generated from the treatment solutions during the treatment of the substrate; and a lifting member configured to move at least one of the supporting member and the treatment liquid collecting member so as to change a height of the supporting member relative to inlets of the treatment liquid collecting vessels, wherein each of the plurality of treatment liquid collecting vessels include, an inner collecting vessel closest to the supporting member, the inner collecting vessel including, an inner base including a bottom wall, an inner wall, and an outer wall that form a second space for receiving the treatment solution and the pollutant gas, the bottom wall of the inner base including a drain hole for discharging the treatment solution, the inner wall of the inner base including a first opening for discharging the pollutant gas, and an inner guide on the outer wall of the inner base providing a passage to introduce the treatment solution and the pollutant gas into the second space formed in the inner base, and an outer collecting vessel surrounding the inner collecting vessel and more distant from the supporting member, the outer collecting vessel including, an outer base including a bottom wall and an outer wall that form a third space for receiving the treatment solution and the pollutant gas, the outer base including a drain hole for discharging the treatment solution, and an outer guide on the outer wall of the outer base providing a passage to introduce the treatment solution and the pollutant gas into the third space formed in the outer base, wherein the exhaust member includes a separating plate dividing the third space, such that the pollutant gas introduced into the third space through the outer guide is separately discharged from a pollutant gas introduced into the third space through the inner guide and the inner base, an upper end of the separating plate being coupled with the bottom wall of the inner base and a lower end of the separating plate being coupled with the bottom wall of the outer base, and wherein the first opening is disposed higher than the upper end of the separating plate.

2. The apparatus of claim 1, wherein the plurality of treatment liquid collecting vessels surround the supporting member one after another, and wherein a height of the inlet of each treatment liquid collecting vessel increases with distance from the supporting member.

3. The apparatus of claim 1, wherein the inner guide is on the outer wall of the inner base and includes a groove-protrusion engagement structure on an upper end of the outer wall of the inner base and a lower end of the inner guide.

4. The apparatus of claim 1, wherein the outer base includes a plurality of exhaust holes, and wherein the exhaust member includes a plurality of exhaust tubes each connected to one of the exhaust holes of the outer base.

5. The apparatus of claim 4, wherein
the exhaust holes are formed in an edge region of the outer base, and
the separating plate divides the third space of the outer base into an inner space and an outer space, the inner space communicating with the exhaust hole of the inner base and at least one of the exhaust holes of the outer base, the outer space communicating with the outer guide and at least one of the exhaust holes of the outer base.

6. The apparatus of claim 4, wherein
the exhaust holes are formed in an edge region of the outer base, and
the separating plate includes,
    a barrier portion between the edge region and a center region of the outer base and forming an inner space communicating with the exhaust hole of the inner base, and
    an extension portion protruding from the barrier portion into the edge region of the outer base so as to extend the inner space of the barrier portion into the edge region of the outer base and communicate with some of the exhaust holes of the outer base.

7. The apparatus of claim 4, wherein
the outer base includes an upwardly protruded ridge on a bottom, and
the separating plate has a lower end including a groove corresponding to the ridge of the outer base, such that the separating plate is coupled to the outer base by engaging the groove and the ridge.

8. The apparatus of claim 4, wherein each of the exhaust tubes connected to the exhaust holes has a leading end protruded from the bottom wall of the outer base by a length.

9. The apparatus of claim 1, wherein
each of the plurality of treatment liquid collecting vessels include at least one middle collecting vessel between the inner collecting vessel and the outer collecting vessel, the middle collecting vessel including,
    a middle base including a bottom wall, an inner wall, and an outer wall that form a fourth space for receiving the treatment solution and the pollutant gas, the middle base including a drain hole for discharging the treatment solution, and the inner wall of the middle base including a second opening for discharging the pollutant gas, and
    a middle guide on the outer wall of the middle base and providing a passage to introduce the treatment solution and the pollutant gas into the fourth space formed in the middle base.

10. The apparatus of claim 9, wherein
the middle base and the inner base are one piece,
the inner guide is on the outer wall of the inner base and includes a groove-protrusion engagement structure on an upper end of the outer wall of the inner base and a lower end of the inner guide,
the middle guide is on the outer wall of the middle base and includes a groove-protrusion engagement structure on an upper end of the outer wall of the middle base and a lower end of the middle guide, and
the outer guide is on the outer wall of the inner base and includes a groove-protrusion engagement structure on an upper end of the outer wall of the outer base and a lower end of the outer guide.

11. The apparatus of claim 9, wherein
the treatment solutions include at least two different etching solutions supplied to the substrate on the supporting member at different times and a cleaning solution supplied to the substrate on the supporting member at a different time from the etching solutions,
the apparatus further comprising:
    a controller configured to controls the lifting member such that the cleaning solution is discharged through the outer collecting vessel and the etching solutions are discharged through the inner collecting vessel and the middle collecting vessel.

12. The apparatus of claim 9, wherein
the outer base includes a plurality of exhaust holes, and
the exhaust member includes,
    a plurality of exhaust tubes each connected to one of the exhaust holes, and
    a separating plate dividing the space formed in the outer base into a plurality of compartments, such that pollutant gases introduced into the space of the outer base through the inner guide, the outer guide, and the middle guide are separately discharged through different exhaust tubes.

13. The apparatus of any one of claim 1, wherein the treatment solutions include at least two different etching solutions supplied to the substrate on the supporting member at different times.

14. The apparatus of claim 13, wherein the treatment solutions include a cleaning solution supplied to the substrate on the supporting member at a different time from the etching solutions.

15. The apparatus of claim 1, wherein
the drain hole of the outer base is in the bottom wall of the outer base.

16. The apparatus of claim 1, wherein
the supporting member includes a supporting plate configured to receive the substrate thereon, a supporting shaft configured to support the supporting plate, and a substrate driving unit configured to rotate the supporting shaft,
the treatment liquid supplying member includes a nozzle disposed above the substrate placed on the supporting plate during a process, a supporting arm coupled to the nozzle, and a nozzle driving unit configured to actuate the supporting arm to move the nozzle toward and away from the substrate placed on the supporting plate, and
the lifting member includes a base to which the supporting plate and the supporting arm are fixed, and a vertical driving unit configured to move the base up and down.

17. The apparatus of claim 1, wherein a discharge path discharging the treatment solutions and a discharge path discharging the pollutant gases are separated.

18. The apparatus of claim 1, wherein the outer guide surrounds the inner guide.

19. The apparatus of claim 1, wherein each of the plurality of treatment liquid collecting vessels include at least one middle collecting vessel between the inner collecting vessel and the outer collecting vessel, the middle collecting vessel including,
- a middle base including a bottom wall, an inner wall, and an outer wall that form a fourth space for receiving the treatment solution and the pollutant gas,
- a middle guide disposed on the outer wall of the middle base and providing a passage to introduce the treatment solution and the pollutant gas into the space formed in the middle base, and
- wherein the upper end of inner wall of the middle base is spaced from the bottom wall of the inner base such that a second opening is defined by the upper end of inner wall of the middle base and the bottom wall of the inner base, the second opening acting as a passage which the pollutant gas introduced into the fourth space are introduced into the third space.

20. The apparatus of claim 19, wherein the inner wall of the middle base and the outer wall of inner base are at the same surface.

* * * * *